United States Patent [19]

Harada

[11] 4,404,466

[45] Sep. 13, 1983

[54] SOLID STATE IMAGE SENSOR WITH LAG CONTROL ELECTRODE

[75] Inventor: Nozomu Harada, Yokohama, Japan

[73] Assignee: Tokyo Shibaura Denki Kabushiki Kaisha, Kawasaki, Japan

[21] Appl. No.: 251,935

[22] Filed: Apr. 7, 1981

[30] Foreign Application Priority Data

Apr. 17, 1980 [JP] Japan ................................. 55-49552

[51] Int. Cl.³ .......................................... H01J 40/14
[52] U.S. Cl. ................................... 250/211 J; 357/24
[58] Field of Search ............... 250/211 J, 578; 357/24, 357/31, 32

[56] References Cited

PUBLICATIONS

"Charge Transfer Device", by Carlo H. Sequin and Michael F. Tompsett, Academic Press, Inc., NY, 1975, pp. 168 and 169.

*Primary Examiner*—David C. Helms
*Assistant Examiner*—Darwin R. Hostetter
*Attorney, Agent, or Firm*—Oblon, Fisher, Spivak, McClelland & Maier

[57] ABSTRACT

A lag control electrode is mounted on that portion of a cell constituting a picture element which is disposed on one end portion of an N+ layer. A gate electrode is provided close to the other end portion of the N+ layer. Where a picture light enters a solid state image sensor, then a signal charge is generated in a P type semiconductor substrate. The signal charge thus produced is collected in the N+ layer. Only during the period in which the lag control electrode is impressed with a prescribed level of voltage, then part of the signal charge is trapped in interface states between that portion of a SiO₂ layer which lies below the lag control electrode and the N+ layer. Only during the period in which the gate electrode is impressed with a prescribed level of voltage, the signal charge collected in the N+ layer is delivered to the channel layer of a CCD shift register.

11 Claims, 16 Drawing Figures

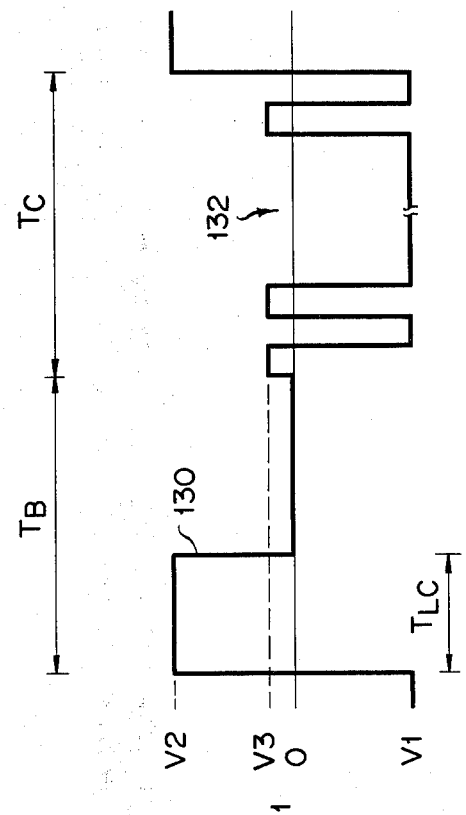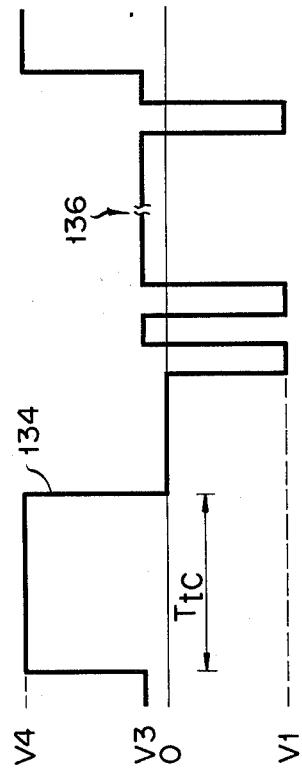
FIG. 12A Φ₁
FIG. 12B Φ₂

SOLID STATE IMAGE SENSOR WITH LAG CONTROL ELECTRODE

This invention relates to a solid state image sensor having a lag characteristic.

A solid state image sensor generally causes almost all signal charge generated in a photosensing section in accordance with the intensity of a received picture light to be read out in a prescribed length of time. Where a picture light is contaminated by undesired luminosity irregularities such as flickers arising when photographing is carried out under illumination, for example, by a fluorescent lamp, then the flickers truthfully appear in a reproduced image, resulting in a decline in a picture quality. Particularly in recent years a fluorecent lamp is applied more often for various reasons. Where, therefore, it is desired to obtain a good picture quality where indoor photographing is carried out by a camera containing the aforesaid solid state image sensor, it is necessary to jointly use a special illumination implement, for example, a tungsten lamp. However, this requirement greatly restricts the range of foreground conditions in which photography can be taken with a good picture quality by a camera fitted with the aforesaid solid state image sensor. Therefore, strong demand has been made for the development of a solid state image sensor having such lag characteristic as can be adapted for the condition in which a camera fitted with the solid state image sensor is applied.

It is according the object of this invention to provide a solid state image sensor whose lag characteristic can be suitably controlled and which provides a good picture quality.

To attain the above-mentioned object, the invention provides a solid state image sensor which comprises photosensing means for generating an electric charge corresponding to a received light, signal generating means for sending forth at least one electric signal having a predetermined voltage waveform, storage means for trapping a prescribed amount of an electric charge included in that which is produced by the photosensing means in response to the electric signal for a predetermined period of time, thereby to control an afterimage, and gate means for reading out an electric charge generated at least by the photosensing means.

This invention can be more fully understood from the following detailed description when taken in conjunction with the accompanying drawings, in which.

Figure 1:
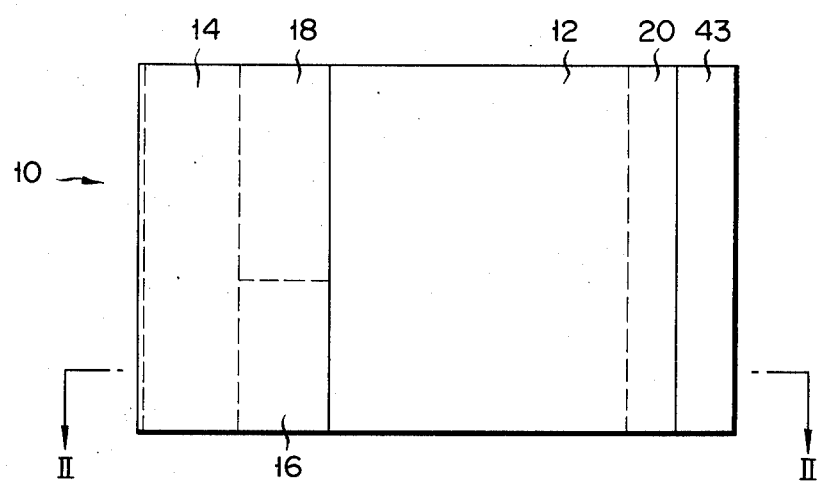
FIG. 1 is a schematic plan view of a cell constituting any of the picture elements of a solid state image sensor according to a first embodiment of this invention.
Figure 2:
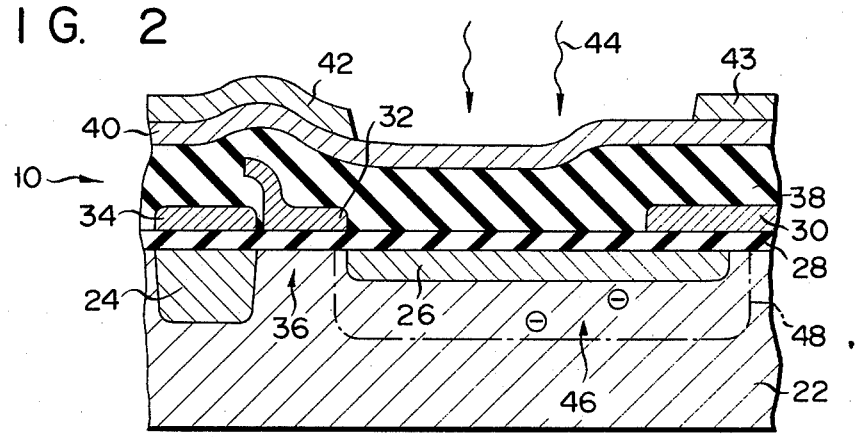
FIG. 2 is a cross sectional view in line II—II of the cell of FIG. 1.
Figure 3:
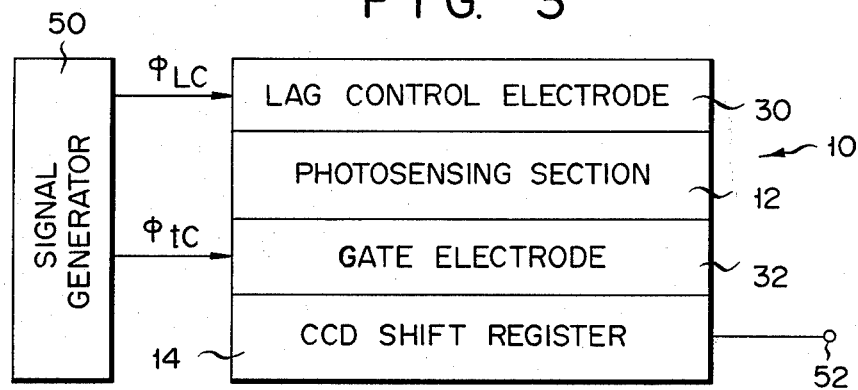
FIG. 3 is a block diagram of the solid state image sensor of FIG. 1.
Figure 5:
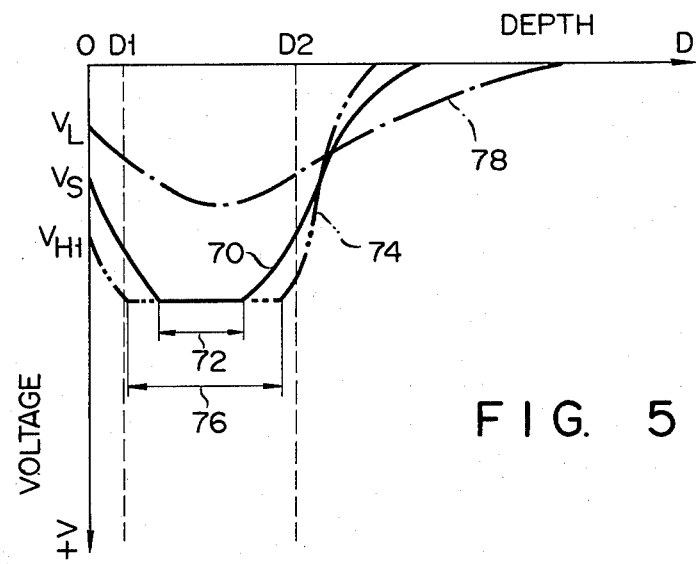
Figure 6:
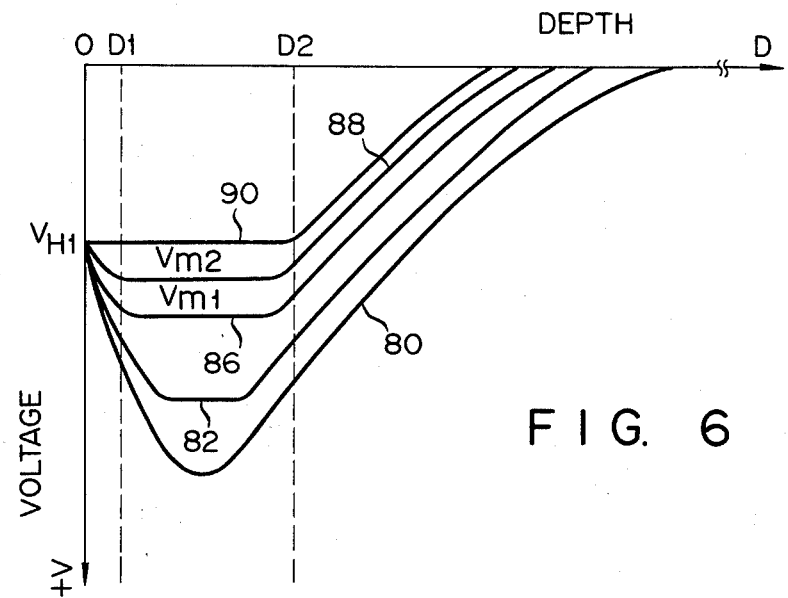
Figure 7:
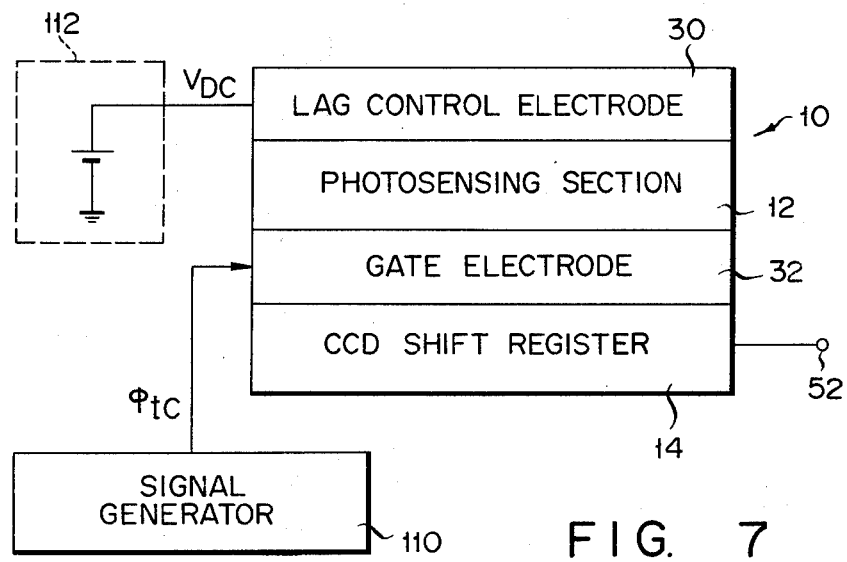
Figure 8:
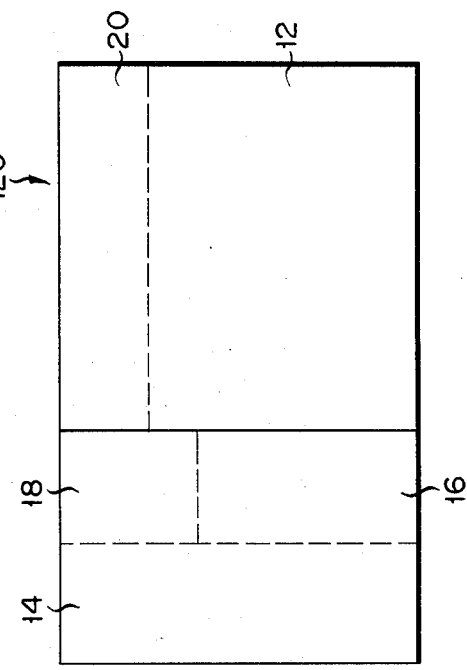
Figure 9:
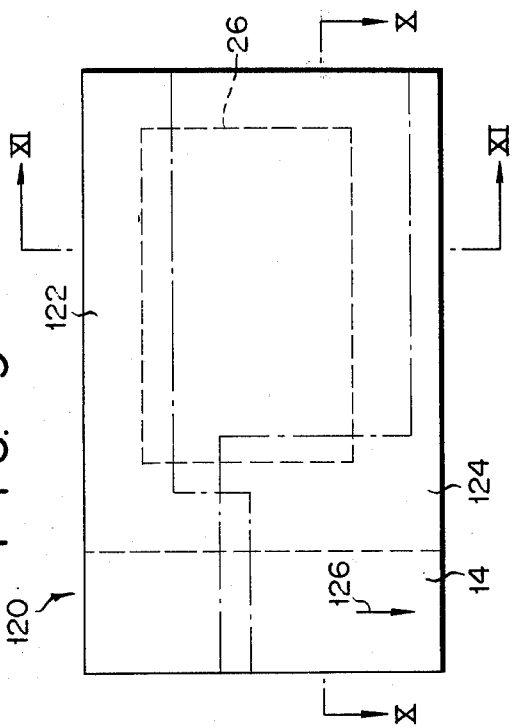
Figure 11:
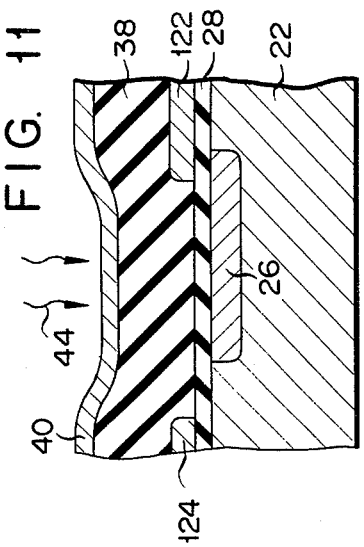
Figure 10:
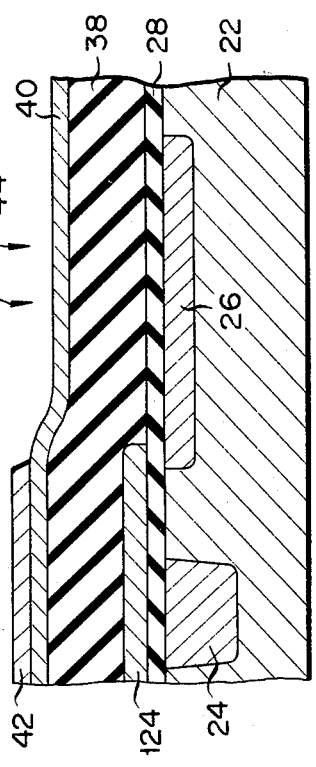

FIG. 5 graphically shows a potential distributed in the direction of the depth of the photosensing section of the solid state image sensor of FIGS. 1 to 3;

FIG. 6 graphically indicates a potential distributed in the direction of the photosensing section of the solid state image sensor of FIGS. 1 to 3 corresponding to the signal charge accumulated in the photosensing section;

FIG. 7 is a block diagram of a solid state image sensor according to a second embodiment of the invention;

FIG. 8 is a schematic plan view of any of the picture elements of a solid state image sensor according to a third embodiment of the invention;

FIG. 9 indicates the planar shape of a charge shift electrode provided in the cell of FIG. 8;

FIG. 10 is a cross sectional view on line X—X of the cell of FIG. 9;

FIG. 11 is a cross sectional view on line XI—XI of the cell of FIG. 11; and

FIGS. 12A and 12B illustrate the waveforms of control signals supplied to the solid state image sensor of FIGS. 8 to 11.

Referring to FIGS. 1 to 3, a cell 10 constituting any of the picture elements of an image sensor (an interline transfer type charge-coupled device) includes a photosensing section 12 for generating and storing a signal charge and a CCD transfer section 14 for transferring a signal charge accumulated in the photosensing section 12. Provided between the mutually facing sides of the photosensing section 12 and CCD transfer section (hereinafter referred to as "a CCD shift register") 14 are a gate section 16 and channel stopper section 18 for electrically insulating both sections 16, 18 from each other. A storage section 20 is formed adjacent to the opposite side of the photosensing section 12.

FIG. 2 is a cross sectional view of the cell 10 on line II—II of FIG. 1. A silicon substrate 22 has for example, a P type conductivity. Formed in the substrate 22 are an N type semiconductor layer constituting the CCD shift register section 14, namely, a channel layer and a highly concentrated N type semiconductor layer, or N+ type layer 26 of the photosensing section 12. A silicon oxide layer 28 (hereinafter referred to as "a $SiO_2$ layer") is further formed on the substrate 22. Mounted on the $SiO_2$ layer 28 are a lag control electrode 30. Gate electrode 32 and charge shift electrode 34 of the CCD shift register 14, all these electrodes being formed of metal. Part of the lag control electrode 30 is overlaid on the N+ layer 26. The gate electrode 32 is disposed on a gate region 36 of the substrate 22 which is defined between the channel layer 24 and N+ layer 26. The charge shift electrode 34 is positioned above the channel layer 24 with the $SiO_2$ layer 28 interposed therebetween. Another silicon oxide or $SiO_2$ layer 38 is spread, for example, by chemical vapor deposition (CVD) over the aforesaid $SiO_2$ layer 28, afterimage control electrode 30, gate electrode 32 and charge shift electrode 34. Disposed on the latter $SiO_2$ layer 38 is a transparent layer 40, on which aluminium electrodes 42, 43 are mounted. The transparent layer 40 is formed of a conductive layer of stannic oxide ($SnO_2$) having a high permeability to an incoming light 44. The aluminium electrode 42 substantially covers the CCD shift register 14, gate section 16 and channel stopper 18. The other aluminium electrode 43 is set on the lag control electrode 30. An incoming light 44 is partly shut off by the aluminium electrodes 42, 43. Only the photosensing section 12 and part of the afterimage control electrode 30 are illuminated by the incoming light 44. Therefore, a minority carrier electron corresponding to the incoming light 44, namely, a signal charge 46 (FIG. 2) is collected in the N+ layer 26 and that part of the substrate 22 which lies close to the N+ layer 26. The signal charge 46 is collected in a depletion layer 48 of the substrate 22.

As shown in the block diagram of FIG. 3, the cell 10 of the solid state image sensor of FIGS. 1 and 2 is connected to a signal generator 50, whose output terminals are respectively connected to the lag control electrode 30 and gate electrode 32. Output prescribed control signals $\phi_{LC}$, $\phi_{tC}$ from the signal generator 50 are respectively transmitted to the storage section 20 and gate section 16 through the corresponding lag control electrode 30 and gate electrode 32. A signal charge transferred by the CCD shift register 14 is read out at an output terminal 52 (FIG. 3) of the cell 10.

Figure 4A:
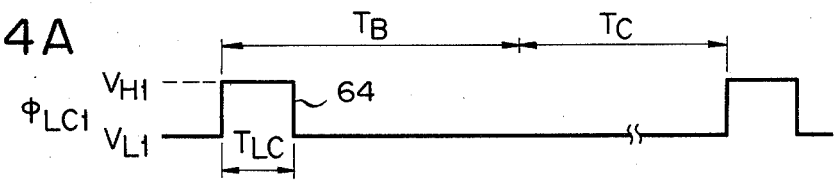
FIGS. 4A to 4D illustrate the waveforms of control signals supplied to the solid state image sensor of FIG. 3.
Figure 4B:
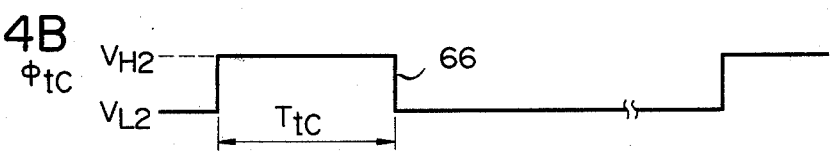

FIGS. 4A and 4B respectively indicate pulse signals $\phi_{LC1}$, $\phi_{tC}$ examplifying output control signals $\phi_{LC}$, $\phi_{tC}$ from the signal generator 50. The pulse signal $\phi_{LC1}$ supplied to the lag control electrode 30 (FIG. 2) of the storage section 20 for a given time period of blanking period is a digital signal whose voltage level changes from a low level $V_{L1}$ to a high level $V_{H1}$, or vice versa. One field period or one frame period of the cell 10 is divided the blanking period $T_B$ and storage period $T_C$. The pulse signal $\phi_{LC1}$ includes a waveform component 64, . . . whose voltage level rises from a low level $V_{L1}$ to a high level $V_{H1}$ at the beginning of the blanking period $T_B$ and is later held at this high level $V_{H1}$ for a given period of time $T_{LC}$. Therefore, only during the period $T_{LC}$ in which the waveform component 64, . . . retains the high level $V_{H1}$, part of the signal charge 46 (FIG. 2) is trapped in the interface states (not shown) between the SiO$_2$ layer 28 and N$^{30}$ layer 26 (FIG. 2).

The lag control electrode 30 is impressed with a low potential $V_{L1}$ during the remainder of one frame period following the period $T_{LC}$ included in said frame period, causing the signal charge trapped in the abovementioned interface states to be thermally released from the storage section 20.

Another pulse signal $\phi_{tC}$ supplied to the gate electrode 32 (FIG. 2) of the gate section 16 is a digital signal whose voltage level changes from a low level $V_{L2}$ to a high level $V_{H2}$, or vice versa and includes a waveform component 66, . . . (FIG. 4B). Like the waveform component 64, . . . of the pulse signal $\phi_{LC1}$ of FIG. 4A, the waveform component 66 of FIG. 4B rises from a low level $V_{L2}$ to a high level $V_{H2}$ at the beginning of the blanking period, and retains said high level $V_{H2}$ for a longer period $T_{tC}$ than the period $T_{LC}$ during which the waveform component 64, . . . of the pulse signal $\phi_{LC1}$ of FIG. 4A in held at a high level. Therefore, only during the high level period $T_{tC}$, the other portion of the signal charge 46 generated by the photosensing section 12 than that trapped by the lag control electrode 30 is all delivered to the CCD shift register 14 through the gate section 16, that is, the region 36 (FIG. 2) below the gate electrode 32. The above-mentioned signal charge thermally released from the storage section 20 is supplied to the CCD shift register 14 through the gate section 16 by being delayed for some time during a period $T_{tC}-T_{LC}$ corresponding to a difference between the high potential period $T_{LC}$ of the pulse signal $\phi_{LC1}$ of FIG. 4A and the high potential period $T_{tC}$ of the pulse signal $\phi_{tC}$ of FIG. 4B. Where both pulse signals $\phi_{LC1}$, $\phi_{tC}$ respectively fall to low levels $V_{L1}$, $V_{L2}$, then the gate section 16 is closed to suspend the transfer of a signal charge.

Description is now given with reference to FIGS. 2 and 5 of a solid state image sensor according to a first embodiment of this invention which is arranged as described above. FIG. 5 graphically illustrates a potential distributed through the depth D of that portion of the substrate 22 which corresponds to the photosensing section 12 (This potential distribution is indicated on the assumption that impurities are diffused in the semiconductor substrate 22 and N$^+$ layer 26 at a uniform concentration regardless of the site of diffusion.). The SiO$_2$ layer 28 (FIG. 2) corresponds to that section of the total depth D which is defined between O and $D_1$. The N$^+$ layer 26 corresponds to the $D_1$ to $D_2$ section, and the substrate 22 to the $D_2$-D section.

Now let it be assumed that the transparent electrode 40 is impressed with a prescribed voltage, causing the surface potential of that portion of the SiO$_2$ layer 28 which corresponds to the photosensing section 12 to stand at $V_s$. Where, under the abovementioned condition, the photosensing section 12 receives a picture light, then a signal charge 46 generated in the substrate 22 is collected in the depletion layer 48 and then brought into the N$^+$ layer 26. At this time the potential of the photosensing section 12 is distributed as shown by curve 70 of FIG. 5. Curve 70 includes a flat section 72 impressed on that portion of the photosensing section 12 which corresponds to the N$^+$ layer 26. Therefore, it is seen that the signal charge is concentrated in the N$^+$ layer 26 corresponding to the flat section 72.

Next, the lag control electrode 30 is supplied with the pulse signal $\phi_{LC1}$ of FIG. 4A. Curve 74 of FIG. 5 shows a potential distributed through that portion of the substrate 22 which lies below the lag control electrode 30 during the period $T_{LC}$ in which the electrode 30 is impressed with the high voltage $V_{H1}$ under the abovementioned condition. The potential distribution curve 74 includes a flat section 76 extending from the proximity of the depth $D_1$ corresponding to the interface states between the SiO$_2$ layer 28 and N$^+$ layer 26. Since the flat section 76 substantially reaches the aforesaid interface states between the SiO$_2$ layer 28 and N$^+$ layer 26, it it seen that part of the signal charge 46 is trapped is said interface states. If the high voltage $V_{H1}$ continues to be impressed on the lag control electrode 30, then the signal charge trapped or collected in the aforesaid interface states continues to be retained therein until the succeeding readout procedure is commenced, even after the greater part of the signal charge which was not trapped in the interface states is delivered to the CCD shift register 14. Where the low voltage $V_{L1}$ is impressed on the lag control electrode 30 by the signal $\phi_{LC1}$ of FIG. 4A, then the potential of the substrate 22 is distributed as illustrated by curve 78 (FIG. 5). Curve 78 shows that a maximum voltage impressed on that portion of the N$^+$ layer 26 which lies below the lag control electrode 30 is electrically lower than the potential retained in the flat section 72 or 76. Therefore, the signal charge trapped in an interface states between the SiO$_2$ layer 28 and N$^+$ layer 26 is left free, and thermally diffused into that portion of the N$^+$ layer 26 corresponding to the photosensing section 12 which does not lie below the lag control electrode 30. At this point and also during the period $T_{tC}-T_{LC}$ in which the gate electrode 32 is impressed with a high voltage $V_{H2}$ of FIG. 4B, the signal charge 46 thus diffused is carried to the CCD shift register 14. Said signal charge gives rise to an afterimage, as an afterimage is produced in the conventional image pickup tube. Where the gate section 16 is closed, the transfer of the signal charge is stopped. Where the lag control electrode 30 continues to be impressed with a low voltage $V_{L1}$, then the signal charge is not trapped in an interface states between that portion of the SiO$_2$ layer 28 which lies below the lag control electrode 30 and the N$^+$ layer 26.

With a solid state image sensor according to the first embodiment of this invention which is arranged as described above, it is possible to change freely and minutely an amount of a signal charge trapped in the aforementioned interface states and a period in which the signal charge is trapped in accordance with the voltage levels of control signals $\phi_{LC}$, $\phi_{tC}$ impressed on the lag control electrode 30 and gate electrode 32 or a period in which the control signals $\phi_{LC}$, $\phi_{tC}$ are supplied to the subject solid state image sensor. Namely, where it is desired to increase the proportion of an afterimage relative to a regular image, then it is advised to impress a pulse signal $\phi_{LC}$ having a high voltage $V_H$ on the lag control electrode 30, or prolong the period $T_{LC}$ in which the pulse signal is impressed on the lag control electrode 30. Conversely where it is not required to produce an afterimage as in the case where photographing is carried out in the natural sunlight or a dark foreground subject is photographed, then it is advised to impress the lag control electrode 30 of the storage section 20 with a low voltage $V_{L1}$.

Further, the previously described solid state image sensor according to the first embodiment of the invention enables an amount of a signal charge trapped in the storage section 20 to vary with the intensity of a picture light brought into the cell 10. The reason for this is given below with reference to FIGS. 2 and 6.

FIG. 6 graphically shows a potential distributed through the total depth D of that portion of the substrate 22 which lies below the lag control electrode 30 of the storage section 20. Referring to FIG. 6, the $O-D_1$, $D_1-D_2$, and $D_2-D$ sections respectively correspond to the $SiO_2$ layer 28, $N^+$ layer 26 and substrate 22. Where the lag control electrode 30 of the storage section 20 is impressed with a high voltage $V_{H1}$ and a signal charge is not present in the $N^+$ layer 26, then the potential is distributed as shown by curve 80. This curve 80 does not have a flat section. Where a signal charge is present in the $N^+$ layer in a smaller amount than prescribed, that is, where the photosensing section 12 is illuminated by a picture light (dark light) having a smaller amount than prescribed, then the potential is distributed as shown by curve 82. This curve 82 includes a flat section formed in the $D_1-D_2$ region. This flat section does not lie near a depth level $D_1$, namely, an interface states between that portion of the $SiO_2$ layer 28 which lies below the lag control electrode 30 and the $N^+$ layer 26. Therefore, a signal charge generated in the $N^+$ layer 26 in an amount corresponding to said flat section is not trapped in the aforementioned interface states. Where a light having a higher intensity, that is, a brighter light is received with an increase in an amount of a signal charge collected in the $N^+$ layer 26, then the potential distribution changes as illustrated by curve 86. The flat section of the curve 86 closely approaches the depth level $D_1$. At this time, said flat section has a potential $V_{m1}$. Where a larger amount of a signal charge is trapped in the $N^+$ layer 26, then the potential is distributed as shown by curve 88. The flat section of curve 88 has a lower potential, as indicated by $V_{m2}$ than the potential $V_{m1}$ of the flat section of curve 86. Where the potentials of the flat sections of curves 88, 86 are respectively changed to $V_{m2}$, $V_{m1}$, then part of a signal charge collected in the $N^+$ layer 26 is trapped in an interface states between that portion of the $SiO_2$ layer 28 which lies below the lag control electrode 30 and the $N^+$ layer 26. (The sooner realized the potential distribution represented by curves 86, 88, the sooner trapped a signal charge in the proximity of the aforesaid interface.) Where a larger amount of a signal charge is trapped, then the potential of the $SiO_2$ layer 28 and that of the $N^+$ layer 26 are almost uniformly distributed with a level equal to $V_H$. In other words, a potential barrier is not produced between the $SiO_2$ layer 28 and $N^+$ layer 26. Consequently a signal charge 46 is smoothly shifted to the interface states between the $SiO_2$ layer 28 and $N^+$ layer 26 to be trapped in the interface states in a larger amount.

For the reason given above, an amount of a signal charge trapped in an interface states between that portion of the $SiO_2$ layer 28 which lies below the lag control electrode 30 and the $N^+$ layer 26 can vary with an amount of a picture light received. Therefore, an afterimage is not produced in that region of the photosensing section 12 where a picture light having a lower luminosity than prescribed is received, namely, a signal charge in generated only in a small amount. An afterimage is produced only in that region of the photosensing section 12, where a bright picture light is received and a large amount of signal charges is trapped. In other words, an afterimage does not appear in the dark region of a reproduced picture, but is produced only in the bright region thereof. This arrangement helps to improve the quality of a reproduced picture. Further, it is possible to freely control the luminosity of a reproduced picture for which an afterimage should be produced by varying the level of the voltage $V_H$ impressed on the lag control electrode 30. Therefore, the lag characteristic of a reproduced picture can be controlled minutely and freely in accordance with the ambient condition in which the subject solid state image sensor is applied. For example, where it is desired to generate a large proportion of an afterimage relative to a regular image, then it is advised to impress the lag control electrode 30 with a voltage stepped up to an extent corresponding to the rate at which it is desired to increase the proportion of an afterimage.

As previously described, a solid state image sensor according to a first embodiment of this invention makes it possible to control a proportion of an afterimage minutely by varying the voltage level of a control pulse signal impressed on the lag control electrode 30 of the control section 20 and the gate electrode of the gate section 16 or a length of time for which the impression of high voltage is sustained. Since an amount of a signal charge trapped in the storage section 20 varies with a signal charge generated in the photosensing section 12, it is possible to prevent an afterimage from being produced in the dark region of a reproduced picture and generate an afterimage only in that bright region of said reproduced picture which has a higher luminosity than predetermined. Further, the luminosity of a reproduced picture for which an afterimage is automatically produced can be freely predetermined by varying the level of a voltage impressed on the lag control electrode 30. Therefore, the proportion of an afterimage relative to the regular image of a reproduced picture can be varied minutely and freely with improvement of picture quality in accordance with the ambient condition in which the subject solid state image sensor is applied.

The pulse signal $\phi_{LC}$ of FIG. 4A supplied to the lag control electrode 30 need not be exclusively used. As obvious from the foregoing description, it is possible to apply the pulse signal $\phi_{LC}$ at a different voltage level and for a different length of time than described with reference to FIG. 4A in accordance with the ambient condition in which the subject solid state image sensor is applied.

Figure 4C:
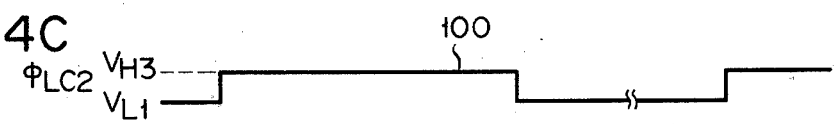
Figure 4D:
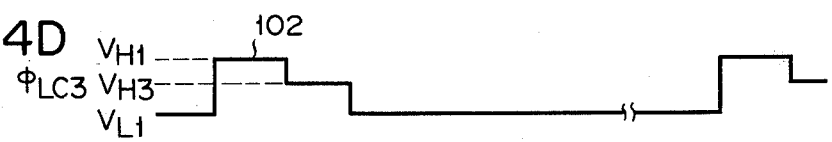

FIGS. 4C and 4D indicate control signals $\phi_{LC2}$, $\phi_{LC3}$ modified from the control signal $\phi_{LC1}$ of FIG. 4A. The modified control signals $\phi_{LC2}$, $\phi_{LC3}$ have the same time scale as those of FIGS. 4A and 4B. The control pulse signal $\phi_{LC2}$ of FIG. 4C which is supplied to the lag control electrode 30 is a digital signal whose voltage level changes between a lower voltage level $V_{L1}$ and a higher voltage level $V_{H3}$ lower than the voltage level $V_{H1}$. A period $T_{LC}$ during which the waveform component 100, . . . of the control signal $\phi_{LC2}$ is sustained at a high voltage level has the same time length as the blanking period. Therefore, only where a received picture light happens to have a higher brightness than a light corresponding to the high voltage level $V_{H3}$, then part of a signal charge is trapped in the storage section 20 for the above-mentioned period $T_{LC}$. Therefore, even after the pulse signal $\phi_{tC}$ of FIG. 4B supplied to the gate electrode 32 has its voltage level reduced to a low level $V_L$, the signal charge continues to be trapped in the storage section 20. Later when the gate electrode 32 is again impressed with a high voltage $V_{H2}$, then the signal charge trapped in the storage section 20 is delivered to the CCD shift register 14 through the gate section 16 after being delayed for a certain length of time. Therefore, the lag characteristic of a reproduced picture can be freely controlled by varying the period during which the control pulse signal $\phi_{tC}$ is supplied to the gate electrode 32.

The pulse signal $\phi_{LC3}$ of FIG. 4D supplied to the lag control electrode 30 includes a stepped waveform component 102, . . . . In other words, the voltage of the control pulse signal $\phi_{LC3}$ rises from a low level $V_{L1}$ to a high level $V_{H1}$, the moment the blanking period $T_B$ is commenced, and is retained at the high level $V_{H1}$ for a prescribed length of time shorter than the blanking period $T_B$. After said prescribed length of time, the voltage of the control pulse signal $\phi_{LC3}$ falls to another high level $V_{H3}$, which, however, is lower than the aforementioned high level $V_{H1}$, and returns to the initial low level $V_{L1}$ prior to the termination of the blanking period $T_B$. Where the control pulse $\phi_{LC3}$ containing the above-mentioned waveform component 102, . . . is supplied to the lag control electrode 30, then an amount of a signal charge trapped in the storage section 20, namely, the lag characteristic of the subject solid state image sensor can be controlled more minutely.

Description is now given of a solid state image sensor of FIG. 7 according to a second embodiment of this invention. A signal generator 110 is connected to the gate electrode 32. An output control signal $\phi_{tC}$ from the signal generator 110 has the same waveform as that of the first embodiment, description thereof being omitted. The lag control eIctrode 30 of storage section 20 is connected to the known D.C. voltage source 112 to be constantly impressed with a prescribed D.C. voltage $V_{DC}$. The other portions of the arrangement of the second embodiment are exactly the same as those of the first embodiment, description thereof being omitted.

With the second embodiment arranged as described above, the lag control electrode 30 of the storage section 20 is always impressed with a prescribed D.C. voltage $V_{DC}$. Therefore, an amount of a signal charge trapped in the storage section 20 can be freely controlled by varying the level of said D.C. voltage $V_{DC}$ or the voltage level of the control signal $\phi_{tC}$ supplied to the gate electrode 32 of the gate section 16, thereby enabling the lag characteristic of a reproduced picture to be minutely controlled with improvement on picture quality. The storage section 20 is connected to the known D.C. voltage generator 112, eliminating the necessity of supplying any particular control signal to the storage section, and consequently simplifying the arrangement of a solid state image sensor and reducing its production cost.

Description is now given with reference to FIGS. 8 to 11 of a solid state image sensor according to a third embodiment of this invention. Any of the cells of the solid state image sensor, each of which constitutes a picture element includes a photosensing section 12, channel stopper 18 and storage section 20 disposed adjacent to both elements 12, 18. FIG. 9 indicates the planar shapes of first and second charge shift electrodes 122, 124 set in the cell 120. The first charge shift electrode 122 is so formed as to extend over about half the CCD shift register 14, channel stopper 18 and storage section 20. The second charge shift electrode 124 is overlaid on that portion of the first charge shift electrode 122 which extends over the CCD shift register 14 and channel stopper 18. The second charge shift electrode 124 further extends over the gate section 16 and that portion of the N+ layer 26 (included in the photosensing section 12) which lies adjacent to the gate section 16. As viewed from the CCD shift register 14, the first and second charge shift electrodes 122, 124 are arranged in a direction indicated by an arrow 126.

FIGS. 10 and 11 are respectively cross sectional views of the cell 120 of FIG. 9 on lines X—X and XI—XI thereof. Referring to FIG. 10, the second charge shift electrode 124 is formed with a prescribed thickness on the SiO$_2$ layer 28 so as to face the upper portions of the channel layer 24 of the CCD shift register 14, gate section 16 and part of the N+ layer 26 of the photosensing section 12. Referring to FIG. 11, the first charge shift electrode 122 is formed on the SiO$_2$ layer 28 so as to face the surface of one end portion of the N+ layer 26 of the photosensing section 12 at a prescribed distance from the other end portion of the N+ layer 26. The other portions of the third embodiment of FIGS. 8 to 11 have the same arrangement as those of the first embodiment of FIG. 2, description thereof being omitted.

The first charge shift electrode 122 is supplied with a first control signal $\phi_1$ of FIG. 12A. The second charge shift electrode 124 is supplied with a second control signal $\phi_2$ of FIG. 12B. The first control signal $\phi_1$ includes a waveform component 130, . . . whose voltage rises from a low level $V_1$ (for example, −8 volts) to a high level $V_2$ (for example, +8 volts) at the beginning of the blanking period $T_B$. The waveform component 130, . . . has its voltage retained at the high level $V_2$ only during a prescribed period $T_{LC}$. The first control signal $\phi_1$ has its voltage held at zero volt during the remainder of the blanking period $T_B$ following the period $T_{LC}$. During the storage period $T_C$, the first control signal $\phi_1$ has its voltage changed from a low level $V_1$ (for example, −8 volts) to a high level $V_3$ (for example, +2 volts) or vice versa. At the beginning of the blanking period $T_B$, the second control signal $\phi_2$ is changed into a waveform component 134, . . . whose starting portion rises from a low level $V_3$ to a high level $V_4$ (for example +10 volts) at the beginning of the blanking period $T_B$. The period $T_{tC}$ during which the waveform component 134, . . . is retained at the high level $V_4$ is chosen to be longer than the period $T_{LC}$. During the storage period $T_C$, the second control signal $\phi_2$ is changed into a second clock pulse 136 which has an opposite phase to that of the first pulse signal 132 (that is, whose phase is displaced 180° from that of the first pulse signal 132).

Description is now given of the operation of a solid state image sensor according to a third embodiment of this invention. Where a picture light enters the cell 120, then a signal charge (not shown) corresponding to an amount of a received light is generated in the substrate 22. Only during the period $T_{LC}$ in which the first control signal $\phi_1$ is supplied to the first charge shift electrode 122, part of a signal charge is trapped in the interface states between that portion of the $SiO_2$ layer 28 which lies immediately below the first charge shift electrode 122 and the N+ layer 26. The signal charge is trapped in an amount corresponding to the potential $V_2$ of the first control signal $\phi_1$ and the period $T_{LC}$ of its supply. The other portion of the signal charge than that which was trapped is delivered to the CCD shift register 14 through the gate section 16 only during the supply period $T_{tC}$ of the second control signal $\phi_2$. A signal charge trapped in the storage section 20 is read out to the CCD shift register 14 through the gate section 16 upon receipt of the second control signal $\phi_2$ during, for example, the following blanking period $T_B$, thereby producing an afterimage. The signal charge delivered to the CCD shift register 14 is successively transferred in a direction indicated by the arrow 126 by supplying a first clock pulse 132 to the first charge shift electrode 122 and a second clock pulse 136 to the second charge shift electrode 124, simultaneously with opposite phases. Therefore, a solid state image sensor according to a third embodiment of this invention enables a proportion of an afterimage relative to a regular image to be minutely controlled by freely varying the voltage level of the waveform component 130, . . . of the first control signal $\phi_1$ and the waveform component 134, . . . of the second control signal $\phi_2$. Further, an amount of a signal charge trapped in the storage section 20 can be freely changed simply by providing two charge shift electrodes 122, 124. A signal charge brought to the CCD shift register 14 can be further transferred. In other words, the third embodiment eliminates the necessity of providing a gate electrode and lag control electrode, thereby assuring the simplification of arrangement, an increase in the integration density and a reduction in manufacturing cost.

Although the present invention has been shown and described with respect to particular embodiments, never the less, various changes and modifications which are obvious to a person skilled in the art to which the invention partains are deemed to lie withiin the spirit, scope and contemplation of the invention.

The foregoing embodiments refer to the case where a CCD type solid state image sensor was applied. However, the present invention allows for the application of other solid state image sensors such as the MOS type, bucket brigade device (BBD), charge injection device (CID) and line address type resistive gate CCD (refer to "IEEE Trans., Vol. ED—25, No. 2, pp. 135-139, 1978 by H. Heyns et al). Obviously, it is possible to apply a solid state image sensor (refer to Television Society Technical Report, ED 480, 1980 by Baji) which comprises a photoconductive layer connected to N+ layer 26 (FIG. 2) and in which a signal charge is produced in an amount corresponding to the intensity of a received picture light by means of said photoconductive layer.

The subject solid state image sensor may be not only of the 2-dimensional sensor type, but also of the single dimensional sensor type. The substrate 22 may of course have not only the P type conductivity, but also the N type conductivity. The materials used with the aforementioned first to third embodiments may be freely exchanged for other materials, provided they have the same properties as those applied in said embodiments. Any of the above-described embodiments is not provided with an overflow drain. However, it is possible to use a solid state image sensor comprising said overflow drain.

The waveforms (FIGS. 4 and 12) of control signals can of course be varied with the ambient condition in which the subject solid state image sensor is applied. In other words, the waveform component $CO_2$, . . . (FIG. 4D) of the pulse signal $\phi_{LC3}$ may be of the type whose voltage level varies in a plurality of steps.

The effect of the present invention is not abstructed even if the surface potential of the $SiO_2$ layer 28 mounted on the N+ layer 26 (embodiments of FIGS. 2, 10 and 11) may be rendered floating.

Description was given with reference to FIG. 2 of the case where past of a signal charge was trapped in the interface states between that portion of the $SiO_2$ layer 28 which was disposed below the lag control electrode 30 and the N+ layer 26. It is also possible to form said interface by ion implantation or by applying silicon nitride (SiN).

What is claimed is:

1. A solid state image sensor which comprises:
   photosensing means for generating a signal charge in an amount corresponding to the intensity of a received picture light;
   signal generating means for generating at least one electrical signal having a prescribed voltage waveform;
   storage means connected to said signal-generating means for trapping a prescribed amount of the signal charge generated by said photosensing means in response to the electricl signal for a predetermined period of time; and
   gate means for reading out the signal charge generated by at least said photosensing means;
   wherein said photosensing means is mounted on one surface of a semiconductor substrate having one conductive type, and comprises a semiconductor layer having a conductivity type opposite to that of said semiconductor substrate; and said storage means comprises an electrode which is partly overlaid on said semiconductor layer and also connected to said signal-generating means;
   wherein said signal-generating means is formed of a signal generator for producing first and second control signals having a prescribed waveform; said storage means traps the signal charge in response to the first control signal; and said gate means allows for the readout of a signal charge generated by said photosensing means and a signal charge trapped by said storage means in response to the second control signal.

2. A solid state image sensor according to claim 1, wherein the first and second control signals are pulse signals which are retained at the same prescribed level for different lengths of time; and said storage means traps such an amount of a signal charge as corresponds to a difference between the sustenance periods of the control pulse signals.

3. A solid state image sensor according to claim 1, wherein the first and second control signals are pulse signals having different voltage levels; and said storage means traps such an amount of a signal charge as corresponds to a difference between the voltage levels of the first and second control pulse signals.

4. A solid state image sensor according to claim 1, wherein the first control signal is a D.C. signal having a prescribed voltage level; the second control signal is a pulse signal which is sustained at a prescribed voltage level for a predetermined period of time; and said storage means traps such an amount of a signal charge as corresponds to the sustenance period of the control pulse signal.

5. A solid state image sensor according to claim 1, which includes charge shift means connected to said gate means for supplying a signal charge read out by said gate means to an output terminal of the image sensor, said charge shift means comprising a third electrode formed on said insulating layer in the proximity of said second electrode and a channel layer formed with the second conductivity type below that portion of the surface of said semiconductor substrate which faces the third electrode across said insulating layer.

6. A solid state image sensor according to claim 1 or 5, wherein said third electrode is constituted by substantially divided electrode sections, one of said devided electrode sections being integrally formed with said first electrode and the other of said devided electrode sections being integrally formed with the second electrode.

7. A solid state image sensor comprising:

a semiconductive substrate of a first conductivity type having a surface;

photosensing means, including a semiconductor layer which is provided at said surface of said semiconductive substrate and is of a second conductivity type opposite to said first conductivity type, for generating a signal charge in an amount corresponding to the intensity of an incident picture light;

signal generating means for generating first and second electrical control signals;

lag control means, electrically connected to said signal generating means to receive said first control signal, for temporarily trapping a first part of said signal charge for a period determined by said first control signal in response to said first control signal and for releasing said first part of said signal charge in response to said first control signal so as to produce a persistence of said incident picture light, said lag control means having a lag control electrode which is connected to said signal generating means, insulated from said semiconductive substrate and so provided above said semiconductive substrate as to partially overlap said semiconductor layer; and gate means, electrically connected to said signal generating means to receive said second control signal for allowing for readout of a second part of said signal charge which is other than said first part of said signal charge and for allowing for readout of said first part of said signal charge upon completion of readout of said second part of said signal charge.

8. A solid state image sensor according to claim 7, wherein the first and second control signals are pulse signals which are retained at the same prescribed level for different lengths of time; and said storage means traps such an amount of a signal charge as corresponds to a difference between the sustenance periods of the control pulse signals.

9. A solid state image sensor accoding to claim 7, wherein the first and second control signals are pulse signals having different voltage levels; and said storage means traps such an amount of a signal charge as corresponds to a difference between the voltage levels of the first and second control pulse signals.

10. A solid state image sensor according to claim 7, wherein the first control signal is a D.C. signal having a prescribed voltage level; the second control signal is a pulse signal which is sustained at a prescribed voltage level for a predetermined period of time; and said storage means traps such an amount of a signal charge as corresponds to the sustenance period of the control pulse signal.

11. A solid state image sensor according to claim 7, wherein said image sensor further comprises an electrically insulative layer deposited between said semiconductive substrate and said lag control electrode, and said lag control means temporarily traps said first part of said signal charge between said insulative layer and that portion of said semiconductor layer which is overlapped by said lag control electrode in response to said first control signal.

* * * * *